United States Patent
Qi et al.

(10) Patent No.: US 11,626,278 B2
(45) Date of Patent: Apr. 11, 2023

(54) CATALYTIC FORMATION OF BORON AND CARBON FILMS

(71) Applicant: Applied Materials, Inc., Santa Clara, CA (US)

(72) Inventors: Bo Qi, San Jose, CA (US); Zeqing Shen, San Jose, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/211,452

(22) Filed: Mar. 24, 2021

(65) Prior Publication Data
US 2021/0305041 A1    Sep. 30, 2021

Related U.S. Application Data

(60) Provisional application No. 62/994,949, filed on Mar. 26, 2020.

(51) Int. Cl.
*H01L 21/02* (2006.01)

(52) U.S. Cl.
CPC .. *H01L 21/02115* (2013.01); *H01L 21/02112* (2013.01); *H01L 21/02271* (2013.01); *H01L 21/02502* (2013.01)

(58) Field of Classification Search
CPC ......... H01L 21/02115; H01L 21/02502; H01L 21/02112; H01L 21/02271
See application file for complete search history.

(56) References Cited

U.S. PATENT DOCUMENTS

2017/0062218 A1* 3/2017 Duan ................ H01L 21/31122
2017/0365450 A1* 12/2017 Bi ..................... H01J 37/32862
(Continued)

FOREIGN PATENT DOCUMENTS

JP    2006-131439 A    5/2006
KR    2017-0063532 A   6/2017
(Continued)

OTHER PUBLICATIONS

International Search Report and Written Opinion dated Jul. 15, 2021 in International Patent Application No. PCT/US2021/022277, 7 pages.

(Continued)

*Primary Examiner* — David Vu
*Assistant Examiner* — Brandon C Fox
(74) *Attorney, Agent, or Firm* — Kilpatrick Townsend & Stockton LLP

(57) ABSTRACT

Exemplary methods of semiconductor processing may include providing a boron-containing precursor to a processing region of a semiconductor processing chamber. A substrate may be disposed within the processing region of the semiconductor processing chamber. The methods may include providing a carbon-containing precursor to the processing region of the semiconductor processing chamber. The carbon-containing precursor may be characterized by a carbon-carbon double bond or a carbon-carbon triple bond. The methods may include thermally reacting the boron-containing precursor and the carbon-containing precursor at a temperature below about 650° C. The methods may include forming a boron-and-carbon-containing layer on the substrate.

18 Claims, 3 Drawing Sheets

(56) References Cited

U.S. PATENT DOCUMENTS

| | | | |
|---|---|---|---|
| 2018/0233350 A1* | 8/2018 | Tois | H01L 21/0272 |
| 2019/0172714 A1* | 6/2019 | Bobek | C23C 16/505 |
| 2020/0027725 A1* | 1/2020 | Weimer | H01J 37/32357 |
| 2020/0105515 A1* | 4/2020 | Maes | H01L 21/02178 |

FOREIGN PATENT DOCUMENTS

| | | |
|---|---|---|
| KR | 2017-0093003 A | 8/2017 |
| TW | I541062 B | 7/2016 |
| TW | 201929089 A | 7/2019 |

OTHER PUBLICATIONS

Application No. PCT/US2021/022277, International Preliminary Report on Patentability, dated Oct. 6, 2022, 6 pages.

\* cited by examiner

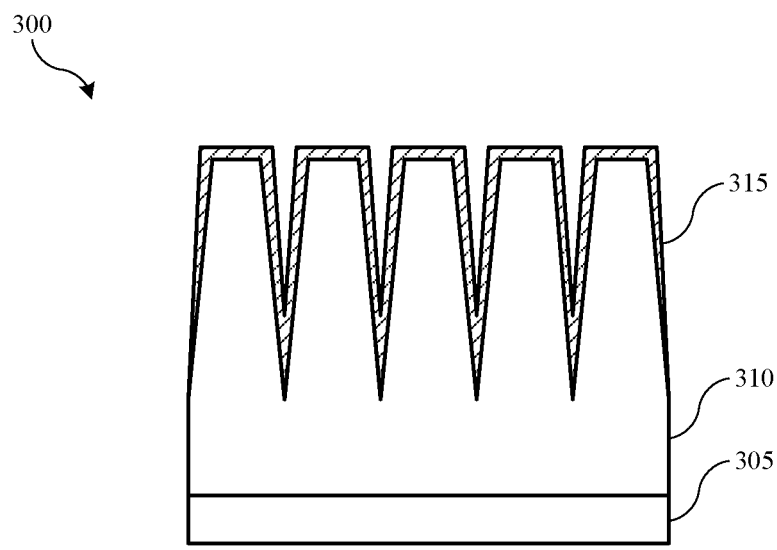
FIG. 3
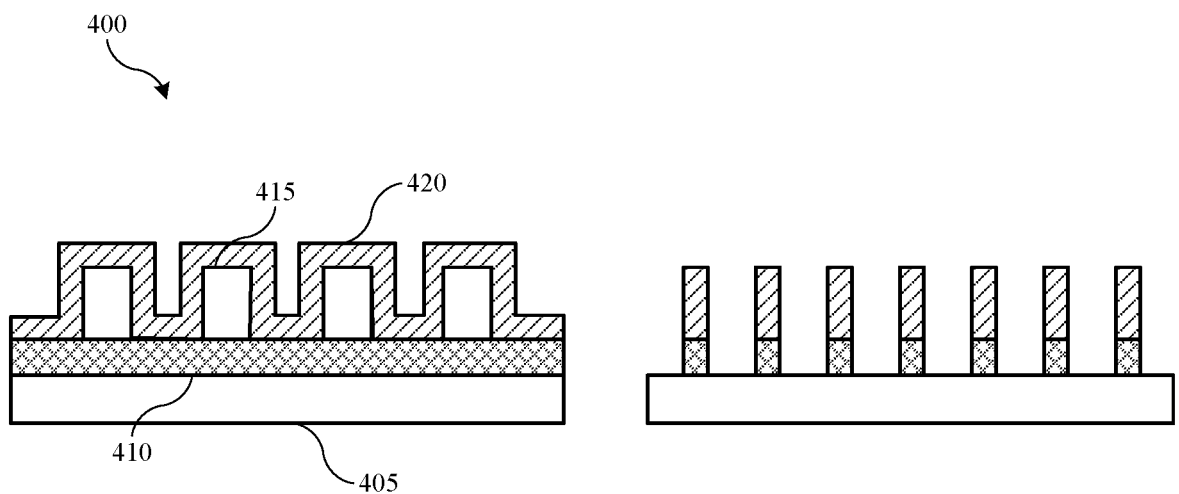
FIG. 4A                    FIG. 4B

US 11,626,278 B2

CATALYTIC FORMATION OF BORON AND CARBON FILMS

CROSS-REFERENCE TO RELATED APPLICATIONS

The present application claims the benefit of U.S. Provisional Application No. 62/994,949, filed Mar. 26, 2020, the contents of which are hereby incorporated by reference in their entirety for all purposes.

TECHNICAL FIELD

The present technology relates to methods and components for semiconductor processing. More specifically, the present technology relates to systems and methods for producing mask or patterning films for semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, aspect ratios of structures may grow, and maintaining dimensions of these structures during removal operations may be challenged. To facilitate patterning of materials on a substrate, mask materials may be employed. As the number of material layers being patterned is expanding, mask selectivity to multiple materials is becoming a greater challenge, along with maintaining mask material properties.

Thus, there is a need for improved systems and methods that can be used to produce high quality devices and structures. These and other needs are addressed by the present technology.

SUMMARY

Exemplary methods of semiconductor processing may include providing a boron-containing precursor to a processing region of a semiconductor processing chamber. A substrate may be disposed within the processing region of the semiconductor processing chamber. The methods may include providing a carbon-containing precursor to the processing region of the semiconductor processing chamber. The carbon-containing precursor may be characterized by a carbon-carbon double bond or a carbon-carbon triple bond. The methods may include thermally reacting the boron-containing precursor and the carbon-containing precursor at a temperature below about 650° C. The methods may include forming a boron-and-carbon-containing layer on the substrate.

In some embodiments, the processing region of the semiconductor processing chamber may be maintained plasma-free while forming the boron-and-carbon-containing layer on the substrate. The boron-and-carbon-containing layer may include or consist essentially of boron, carbon, and hydrogen. The substrate may be characterized by one or more features, and the boron-and-carbon-containing layer may be formed about the one or more features with a conformality of greater than or about 95%. Thermally reacting the boron-containing precursor and the carbon-containing precursor may be performed at a temperature below or about 500° C. The boron-and-carbon-containing layer may be characterized by a boron concentration of greater than or about 40%, and the boron-and-carbon-containing layer may be characterized by a root-mean-square roughness of less than or about 1.8 nm. The boron-and-carbon-containing layer may be characterized by a Young's modulus of greater than or about 80 Gpa. The methods may include forming a plasma of a hydrogen-containing or oxygen-containing precursor within the processing region of the semiconductor processing chamber. The methods may include removing the boron-and-carbon-containing layer from the substrate. The plasma may be maintained halogen-free while removing the boron-and-carbon-containing layer from the substrate. The carbon-containing precursor may be characterized by a carbon-to-hydrogen ratio of greater than or about 1:3.

Some embodiments of the present technology may encompass semiconductor processing method. The methods may include providing a boron-containing precursor to a processing region of a semiconductor processing chamber. A substrate may be disposed within the processing region of the semiconductor processing chamber. The methods may include providing a hydrocarbon to the processing region of the semiconductor processing chamber. The hydrocarbon may be characterized by a carbon-carbon double bond or a carbon-carbon triple bond. The methods may include thermally reacting the boron-containing precursor and the hydrocarbon at a temperature between about 75° C. and about 500° C. The methods may include forming a boron-and-carbon-containing layer on the substrate.

In some embodiments the processing region of the semiconductor processing chamber may be maintained plasma-free during the semiconductor processing method. The boron-and-carbon-containing layer may be characterized by a carbon concentration of greater than or about 40%. The methods may include exposing the boron-and-carbon-containing layer to a wet etchant comprising hydroxide. The methods may include removing the boron-and-carbon-containing layer from the substrate. The boron-and-carbon-containing layer may be characterized by an extinction coefficient of greater than or about 0.01 at 633 nm. The boron-and-carbon-containing layer may be characterized by a hydrogen incorporation of less than or about 50%. The substrate may be characterized by one or more features, and the boron-and-carbon-containing layer may be formed about the one or more features with a conformality of greater than or about 95%.

Some embodiments of the present technology may encompass semiconductor processing methods. The methods may include providing a boron-and-hydrogen-containing precursor to a processing region of a semiconductor processing chamber. A substrate may be disposed within the processing region of the semiconductor processing chamber. The methods may include providing a carbon-containing precursor to the processing region of the semiconductor processing chamber. The carbon-containing precursor may be characterized by a carbon-carbon double bond or a carbon-carbon triple bond. The methods may include thermally reacting the boron-and-hydrogen-containing precursor and the carbon-containing precursor at a temperature below about 600° C. The methods may include forming a boron-and-carbon-containing layer on the substrate. The boron-and-carbon-containing layer may include or consist essentially of boron, carbon, and hydrogen.

In some embodiments, the processing region of the semiconductor processing chamber may be maintained plasma-free while forming the boron-and-carbon-containing layer on the substrate. The boron-and-carbon-containing layer may be characterized by a thickness conformality of greater than or about 95%.

Such technology may provide numerous benefits over conventional systems and techniques. For example, embodiments of the present technology may produce conformal materials applicable to a number of substrate features. Additionally, the present technology may produce boron and carbon films with highly tunable film properties. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 3 shows an exemplary liner produced according to some embodiments of the present technology.

FIGS. 4A-4B show an exemplary spacer structure produced according to some embodiments of the present technology.

Figure 1:
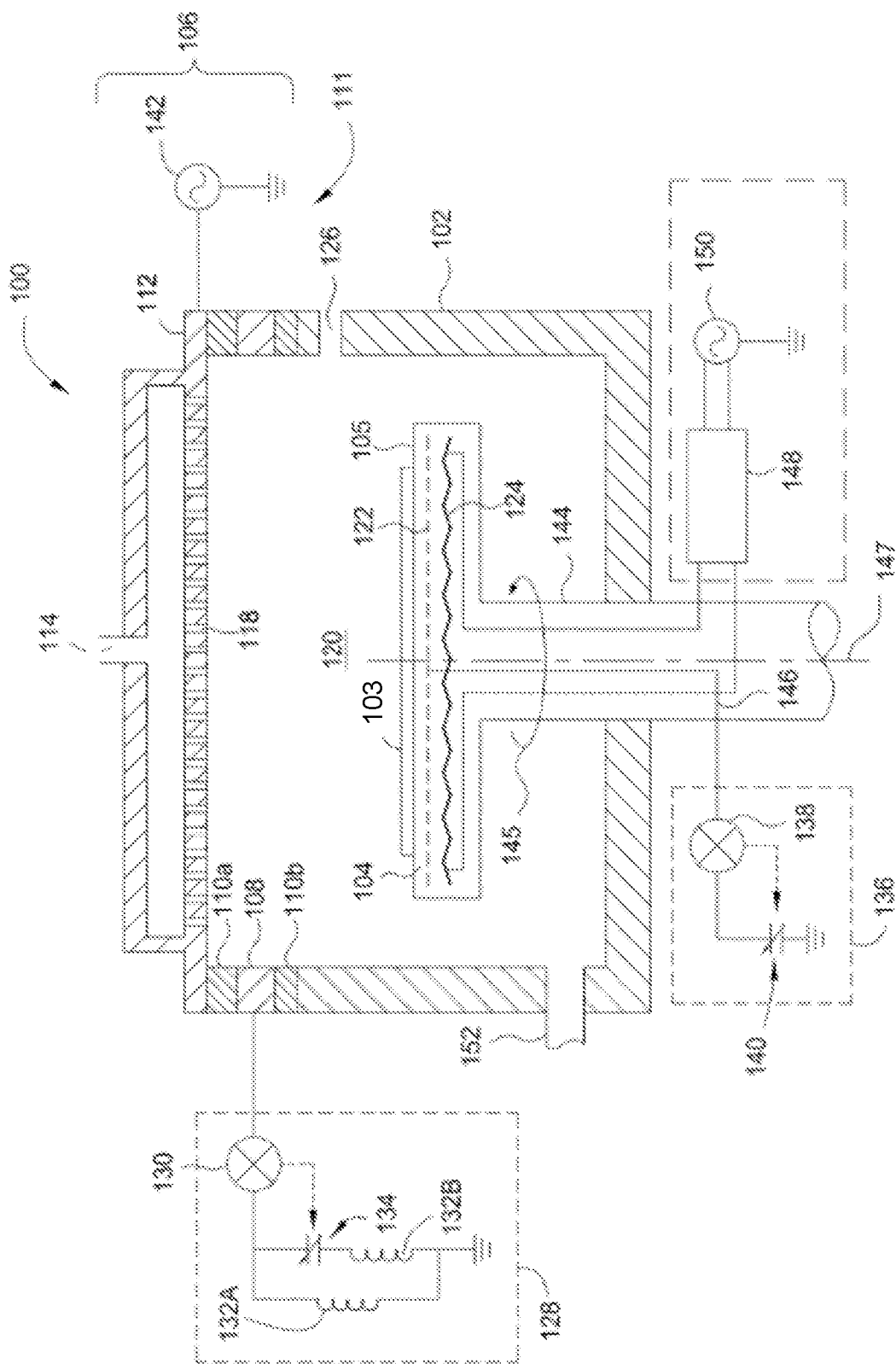
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Hardmask, liners, and spacer films are utilized for a number of processing operations, which may include forming patterns through multiple layers of different materials. Increasing etch selectivity of these materials relative to the structure materials affords tighter control of critical dimensions, especially as feature sizes continue to shrink. Carbon films are often employed as hardmasks, although selectivity for these films is becoming a greater challenge for more complex memory and logic structures, which may have multiple different films on a substrate, and which may require patterning into high aspect ratio features. Accordingly, newer films may include the incorporation of metal and non-metal materials within the film to increase etch selectivity. As one non-limiting example of a non-metal material, boron may be incorporated with a carbon film to increase selectivity relative to a number of oxide and nitride materials. However, as boron incorporation within the film is increased, a number of issues may develop.

Boron, and other non-metal or metal-containing materials, may be included as an additional precursor used in addition to a carbon precursor for the film formation. The precursors may be mixed in a processing region and deposited with a plasma-enhanced chemical vapor deposition process. During the plasma deposition, material may be deposited in a blanket formation, which may not provide conformal coverage. Hence, while a planar layer may be produced, accommodating features of a substrate may be difficult, and pinch-off and other common issues may result, limiting the effectiveness of the film as a protective layer. Thermally depositing carbon films is more difficult as many hydrocarbons may require very high pyrolysis temperatures. Conventional techniques may attempt to overcome this issue to perform a thermally-based process by incorporating additional precursors, such as halogen-containing precursors, to lower a decomposition temperature of the carbon precursor. However, this may reduce adhesion of the film, which may cause undercut during subsequent removal, and may cause film peeling and device failure as well as adjustment of other material properties of the film formed.

The present technology overcomes these issues by performing a thermally-based boron and carbon deposition, which may not utilize additional halogen gas during the deposition process. By performing a catalytic reaction between specific carbon-containing precursors and boron precursors, the present technology may allow lower-temperature chemical-vapor deposition to be performed, which may provide conformal or non-conformal growth on any number of semiconductor structures. The process performed may allow increased tuning of the films being produced, affording films characterized by a variety of material properties for different applications.

Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of producing boron and carbon films are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
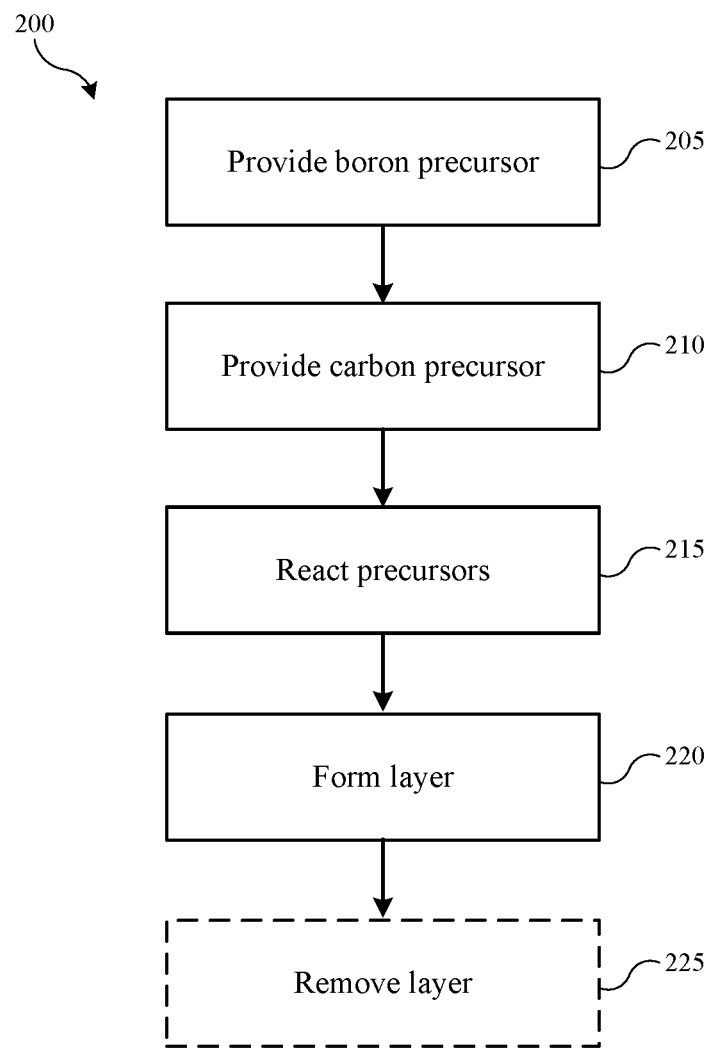
FIG. 2 shows operations in a semiconductor processing method according to some embodiments of the present technology.

As discussed previously, although a plasma-processing chamber may be used for one or more aspects of film processing, in some embodiments forming boron and carbon films may not utilize a plasma-enhanced process, which may limit conformality of the film produced. The present technology may at least form the film without plasma generation in some embodiments. FIG. 2 shows exemplary operations in a processing method 200 according to some embodiments of the present technology. The method may be performed in a variety of processing chambers, including processing chamber 100 described above, as well as any other chambers including non-plasma chambers, in which the operations may be performed. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may include a processing method that may include a number of operations for developing a boron-and-carbon-containing film, which may include a tunable ratio of boron and carbon within the film. As will be explained further below, modifying the ratio of boron and carbon may provide a number of properties to facilitate device processing for a number of structures.

At operation 205, the method may include providing a boron-containing precursor to the processing region of a semiconductor processing chamber where a substrate may be housed. At operation 210, which may occur simultaneously with operation 205, as well as prior to or subsequent operation 205, a carbon-containing precursor may be provided to the processing region of the semiconductor processing chamber. At operation 215, the boron-containing precursor and the carbon-containing precursor may be thermally reacted within the processing region of the semiconductor processing chamber, which may form a boron-and-carbon-containing layer on the substrate at operation 220. Because of the reaction being performed in some embodiments, the semiconductor processing chamber, the pedestal, or the substrate may be maintained at a temperature below or about 650° C., and in some embodiments may be maintained at a temperature that is less than or about 600° C., less than or about 550° C., less than or about 500° C., less than or about 475° C., less than or about 450° C., less than or about 425° C., less than or about 400° C., less than or about 375° C., less than or about 350° C., less than or about 325° C., less than or about 300° C., less than or about 275° C., less than or about 250° C., less than or about 225° C., less than or about 200° C., less than or about 175° C., less than or about 150° C., less than or about 125° C., less than or about 100° C., less than or about 75° C., or less.

As previously discussed, some or all of the formation operations may be performed while the substrate processing region is maintained plasma-free. By performing a thermal chemical-vapor deposition, a more conformal material formation may be produced. Many hydrocarbon precursors are characterized by high pyrolysis temperatures causing challenges with thermal deposition of carbon-containing materials. The present technology may utilize precursors facilitating a catalytic reaction between the boron precursor and the carbon precursor, affording deposition operations performed at lower temperatures. Although any number of boron-containing precursors and carbon-containing precursors may be used, in some embodiments the precursors may be selected to facilitate the catalytic reaction. For example, in some embodiments the boron-containing precursor may be a boron-and-hydrogen-containing precursor, such as hydrides of boron, which may include or consist of boron and hydrogen, and may be characterized by the formula $B_xH_y$, where x and y may be any numbers. Exemplary boron-containing precursors may include borane, diborane, tetraborane, pentaborane, hexaborane, decaborane, or any other boron-containing precursors.

The carbon-containing precursor may be or include any number of carbon-containing precursors. For example, the carbon-containing precursor may be or include any hydrocarbon, or any material including or consisting of carbon and hydrogen. In some embodiments, to facilitate the catalytic reaction between the carbon precursor and the boron precursor, the carbon-containing precursor may be characterized by one or more carbon-carbon double bonds and/or one or more carbon-carbon triple bonds. Accordingly, in some embodiments the carbon-containing precursor may be or include an alkene or an alkyne, or any other carbon-containing material. The precursor may include carbon-and-hydrogen-containing precursors, which may include any amount of carbon and hydrogen bonding, along with any other element bonding, although in some embodiments the carbon-containing precursor may consist of carbon-to-carbon and carbon-to-hydrogen bonding.

A number of factors may impact the carbon and boron concentration within the films. For example, in some embodiments, the produced film may be limited to or consist essentially of boron, carbon, and hydrogen, along with any trace materials, which may account for contaminants, for example. In some embodiments, the boron concentration may be greater than or about 50%, and may be greater than or about 55%, greater than or about 60%, greater than or about 65%, greater than or about 70%, greater than or about 75%, greater than or about 80%, greater than or about 85%, greater than or about 90%, greater than or about 95%, greater than or about 97%, greater than or about 99%, or more, where the film may essentially be a boron film. Similarly, the carbon concentration may be greater than or about 5%, and may be greater than or about 10%, greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, or more. The present technology may be able to adjust the boron and/or carbon concentration based on flow rate, for example, where the flow rates may be adjusted from a ratio of boron precursor to carbon precursor of from about 0.002:1 up to or about 60:1 or higher.

In some embodiments, the flow rate of carbon may afford a carbon concentration up to a threshold, such as less than 50%. However, the present technology may further increase the carbon concentration in produced films by utilizing precursors characterized by a higher carbon concentration. As previously described, the process may include a hydroboration reaction between the precursors. Where carbon-containing precursors include additional carbon atoms, the produced films may have further increased carbon concentration. For example, some carbon-containing precursors may include one or more benzene or other carbon-containing moieties on the precursor. In some embodiments, the catalytic reaction may not occur on the ring structure, which may allow the additional carbon from the benzene to be incorporated within the formed film. This may allow the carbon concentration to be higher compared to conventional technologies.

As noted previously, hydrogen incorporation in the film may impact one or more material properties, as well as the quality of the film produced. Although the carbon-containing precursor and/or the boron-containing precursor may include hydrogen, in some embodiments no additional source of hydrogen may be provided. Although inert precursors or carrier gases may be provided with the boron-containing precursor and the carbon-containing precursor, no other chemically reactive precursors may be delivered with the precursors in some embodiments. By limiting the hydrogen provided to hydrogen included in the carbon-containing precursor and the boron-containing precursor, an atomic ratio of hydrogen within the produced film may be lower than if hydrogen gas were additionally provided.

For example, the atomic ratio of hydrogen in the delivered precursors to boron may be less than or about 20:1 in embodiments, and may be less than or about 18:1, less than or about 15:1, less than or about 14:1, less than or about 13:1, less than or about 12:1, less than or about 11:1, less than or about 10:1, less than or about 9:1, less than or about 8:1, less than or about 7:1, less than or about 6:1, less than or about 5:1, less than or about 4:1, less than or about 3:1, or less. Similarly, the carbon-containing precursor may be characterized by a carbon-to-hydrogen ratio of greater than or about 1:3, and may characterized by a carbon-to-hydrogen ratio of greater than or about 1:2, greater than or about 1:1, greater than or about 2:1, greater than or about 3:1, or greater. This may produce a film characterized by a hydrogen concentration of less than or about 50%, and may produce a film characterized by a hydrogen incorporation of less than or about 45%, less than or about 40%, less than or about 35%, less than or about 30%, less than or about 25%, less than or about 20%, less than or about 15%, less than or about 10%, less than or about 5%, or less. By increasing the hydrogen incorporation, an extinction coefficient of the produced film may be increased, such as providing an extinction coefficient of greater than or about 0.010 at 633 nm, and may provide an extinction coefficient of greater than or about 0.012, greater than or about 0.014, greater than or about 0.016, greater than or about 0.018, greater than or about 0.020, greater than or about 0.025, greater than or about 0.05, greater than or about 0.10, or higher. Consequently, by reducing a hydrogen incorporation within films produced, subsequent lithography or processing operations may be improved.

This limit of hydrogen incorporation may improve a number of characteristics of the film, which may improve the film for use in a variety of applications. Films produced by the present technology may be characterized by a number of material properties that may be impacted by the concentration of boron and/or carbon within the film. For example, adjusting processing conditions may further impact the films produced.

Boron-and-carbon-containing materials formed may be characterized by a Young's modulus greater than or about 50 GPa, and may be characterized by a modulus of greater than or about 80 GPa, greater than or about 90 GPa, greater than or about 100 GPa, greater than or about 110 GPa, greater than or about 120 GPa, greater than or about 130 GPa, greater than or about 140 GPa, greater than or about 150 GPa, or higher. The modulus may increase as the boron concentration within the film increases. Film roughness may also be affected by the boron concentration in the film, where increased boron concentration may also increase roughness. Roughness may be affected by a film thickness produced, and in some embodiments roughness characteristics may be for any film thickness including deposited thickness of less than or about 1,000 nm, and may be characteristic of films deposited to thicknesses of less than or about 500 nm, less than or about 250 nm, less than or about 100 nm, less than or about 50 nm, less than or about 10 nm, less than or about 5 nm, or less. For example, a root-mean-square roughness of deposited films may be less than or about 3.0 nm, and may be less than or about 2.5 nm, less than or about 2.0 nm, less than or about 1.9 nm, less than or about 1.8 nm, less than or about 1.7 nm, less than or about 1.6 nm, less than or about 1.5 nm, less than or about 1.4 nm, less than or about 1.3 nm, less than or about 1.2 nm, less than or about 1.1 nm, less than or about 1.0 nm, less than or about 0.5 nm, less than or about 0.1 nm, less than or about 0.05 nm, less than or about 0.01 nm, or less.

Although the modulus and roughness may both increase with increased boron concentration, in some embodiments deposition temperature may improve both modulus and roughness, where modulus may increase and roughness may decrease. For example, when deposition temperatures are increased to greater than or about 450° C., greater than or about 480° C., or more, film roughness may be lower than roughness of a corresponding film deposited at 400° C. or less. Accordingly, in some embodiments depending on desired film characteristics, deposition may be performed at temperatures between about 450° C. and about 500° C. As one non-limiting example, deposition of a film characterized by 80% boron incorporation when deposited within this range may afford a film characterized by a modulus of greater than or about 150 GPa, while roughness may be maintained below or about 1.5 nm.

Boron-and-carbon materials produced by the present technology may be used in a number of structures, and may be a mask, liner, or spacer, for example, which may be removed after subsequent processing has been performed. Based on the configuration of the materials produced, in some embodiments the film may be removed without the need for halogen-containing plasmas in some embodiments, which may impact etch selectivity with respect to underlying materials, and in some embodiments plasma removal may not be needed at all. For example, in some embodiments after formation of the boron-and-carbon material and subsequent material processing, the boron-and-carbon material may be removed in optional operation 225. In some embodiments, an in situ plasma may be formed of a hydrogen-containing or oxygen-containing precursor within the processing region of the chamber, such as utilizing oxygen, water, or any other oxygen-containing material, which may provide ashing of the boron-and-carbon materials while maintaining or substantially maintaining the underlying materials. Additionally, in some embodiments, a wet etch may be performed. For example, an oxidizing material may be applied to the boron-and-carbon material, which may remove the materials in some embodiments. When carbon incorporation is above a threshold, such as greater than or about 30%, greater than or about 35%, greater than or about 40%, or higher, a hydroxide solution, such as may be mixed with an acid, such as sulfuric acid, may be applied to the substrate, which may remove the boron-and-carbon materials.

As explained previously, in some embodiments the thermally based material formation may provide more conformal films, which may operate as a liner, spacer, hard mask, or other material used during semiconductor processing. FIG. 3 shows an exemplary liner produced according to some embodiments of the present technology. Boron-and-carbon films according to the present technology may be used in any number of applications. In one non-limiting application for 3D NAND structures, boron-and-carbon films may be used to protect stack structures 300 to reduce or limit critical dimension blowout during stack etching. For example, a substrate 305 may have a stack 310 formed, which may be or include alternating oxide and spacer material layers. During memory hole formation, a number of high-aspect-ratio holes may be etched through the structure. In some embodiments of the present technology, after a partial stack etch has been performed, a boron-and-carbon film 315 may be applied over the structure as illustrated. It is to be understood that these examples are not intended to be limiting, as the present technology may be utilized in any number of processing operations, which may include word line cuts, memory contact formation, or any other etch processes. Formation of the film may occur based on methods previously described.

The aspect ratio of the features, or the ratio of the depth of the feature relative to the width or diameter of the feature formed during the etch, may be greater than or about 10:1, and may be greater than or about 15:1, greater than or about 20:1, greater than or about 25:1, greater than or about 30:1, greater than or about 35:1, greater than or about 40:1, greater than or about 45:1, greater than or about 50:1, or more. A plasma-deposited layer may be incapable of accessing deeper within the trench, and pinch off may occur at the top of the feature. However, boron-and-carbon films produced by the present technology may be characterized by coverage fully through the structure as illustrated. For example, a thickness of the film along sidewalls nearer the top of the structure and a thickness of the film along sidewalls nearer the bottom of the structure may be substantially the same, where the film produced is substantially conformal. Accordingly, in some embodiments the film deposited may be characterized by a conformality or a similarity of thickness formed between any two regions along a sidewall of a feature or along the film formed of greater than or about 90%. In some embodiments, the conformality may be greater than or about 93%, greater than or about 95%, greater than or about 96%, greater than or about 97%, greater than or about 98%, greater than or about 99%, or higher. Although the technology may provide highly conformal films, the processing may be adjusted to produce less conformal coverage, which may facilitate certain processing. For example, some embodiments may include forming a first amount of coverage along some exposed surfaces, while limiting coverage on other surfaces. As one non-limiting example, the processing may provide coverage along trench or feature sidewalls, while limiting or providing reduced coverage along a bottom or surfaces near the bottom of a trench or feature. Consequently, the present technology may in some embodiments provide non-conformal coverage.

FIGS. 4A-4B show an exemplary spacer structure 400 produced utilizing boron-and-carbon films according to some embodiments of the present technology. For example, as shown in FIG. 4A during a pattern transfer operation to reduce line width of a layer 410 overlying a substrate 405, mandrels 415 may be formed over which a boron-and-carbon material 420 may be deposited. The boron-and-carbon material may be formed according to methods discussed previously. By forming a conformal film, which may be characterized by any of the conformality percentages previously described, a more precise pattern transfer may be provided. Although FIG. 4B illustrates relatively thin layers, it is to be understood that the features may be characterized by any thickness, which may produce any of the aspect ratios previously described. Where the remaining line structures may be characterized by a limited thickness, such as less than or about 20 nm, less than or about 15 nm, or less, material hardness may impact verticality of the feature produced.

For example, conventional films that may be characterized by reduced modulus or hardness, may bend or tilt as length increases, and in some cases may collapse. By utilizing films according to embodiments of the present technology, improved hardness may be afforded, while limiting film roughness, which may impact pattern transfer. Although some plasma-enhanced depositions may provide materials characterized by increased hardness due to ion bombardment, the deposition process may not be capable of providing conformality, which may prevent use of the material, where pitch walking or incomplete transfer may occur. By utilizing boron-and-carbon materials according to embodiments of the present technology, conformal films may be produced in non-plasma formation, and the produced films may be characterized by improved material properties as well.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   providing a boron-containing precursor to a processing region of a semiconductor processing chamber, wherein a substrate is disposed within the processing region of the semiconductor processing chamber;
   providing a carbon-containing precursor to the processing region of the semiconductor processing chamber, wherein the carbon-containing precursor is characterized by a carbon-carbon double bond or a carbon-carbon triple bond, and wherein the carbon-containing precursor is characterized by a carbon-to-hydrogen ratio of greater than or about 1:3;
   thermally reacting the boron-containing precursor and the carbon-containing precursor at a temperature below about 650° C.; and
   forming a boron-and-carbon-containing layer on the substrate.

2. The semiconductor processing method of claim 1, wherein the processing region of the semiconductor processing chamber is maintained plasma-free while forming the boron-and-carbon-containing layer on the substrate.

3. The semiconductor processing method of claim 1, wherein the boron-and-carbon-containing layer consists essentially of boron, carbon, and hydrogen.

4. The semiconductor processing method of claim 1, wherein the substrate is characterized by one or more features, and wherein the boron-and-carbon-containing layer is formed about the one or more features with a conformality of greater than or about 95%.

5. The semiconductor processing method of claim 1, wherein thermally reacting the boron-containing precursor and the carbon-containing precursor is performed at a temperature below or about 500° C.

6. The semiconductor processing method of claim 1, wherein the boron-and-carbon-containing layer is characterized by a boron concentration of greater than or about 40%, and wherein the boron-and-carbon-containing layer is characterized by a root-mean-square roughness of less than or about 1.8 nm.

7. The semiconductor processing method of claim 6, wherein the boron-and-carbon-containing layer is characterized by a Young's modulus of greater than or about 80 Gpa.

8. The semiconductor processing method of claim 1, further comprising:
   forming a plasma of a hydrogen-containing or oxygen-containing precursor within the processing region of the semiconductor processing chamber; and
   removing the boron-and-carbon-containing layer from the substrate.

9. The semiconductor processing method of claim 8, wherein the plasma is maintained halogen-free while removing the boron-and-carbon-containing layer from the substrate.

10. A semiconductor processing method comprising:
    providing a boron-containing precursor to a processing region of a semiconductor processing chamber, wherein a substrate is disposed within the processing region of the semiconductor processing chamber;
    providing a hydrocarbon to the processing region of the semiconductor processing chamber, wherein the hydrocarbon is characterized by a carbon-carbon double bond or a carbon-carbon triple bond, and wherein the hydrocarbon is characterized by a carbon-to-hydrogen ratio of greater than or about 1:3;
    thermally reacting the boron-containing precursor and the hydrocarbon at a temperature between about 75° C. and about 500° C.; and
    forming a boron-and-carbon-containing layer on the substrate, wherein the processing region of the semiconductor processing chamber is maintained plasma-free during the semiconductor processing method.

11. The semiconductor processing method of claim 10, wherein the boron-and-carbon-containing layer is characterized by a carbon concentration of greater than or about 40%.

12. The semiconductor processing method of claim 11, further comprising:
    exposing the boron-and-carbon-containing layer to a wet etchant comprising hydroxide; and
    removing the boron-and-carbon-containing layer from the substrate.

13. The semiconductor processing method of claim 10, wherein the boron-and-carbon-containing layer is characterized by an extinction coefficient of greater than or about 0.01 at 633 nm.

14. The semiconductor processing method of claim 10, wherein the boron-and-carbon-containing layer is characterized by a hydrogen incorporation of less than or about 50%.

15. The semiconductor processing method of claim 10, wherein the substrate is characterized by one or more features, and wherein the boron-and-carbon-containing layer is formed about the one or more features with a conformality of greater than or about 95%.

16. A semiconductor processing method comprising:
    providing a boron-and-hydrogen-containing precursor to a processing region of a semiconductor processing chamber, wherein a substrate is disposed within the processing region of the semiconductor processing chamber;
    providing a carbon-containing precursor to the processing region of the semiconductor processing chamber, wherein the carbon-containing precursor is characterized by a carbon-carbon double bond or a carbon-carbon triple bond, and wherein the carbon-containing precursor is characterized by a carbon-to-hydrogen ratio of greater than or about 1:3;
    thermally reacting the boron-and-hydrogen-containing precursor and the carbon-containing precursor at a temperature below about 600° C.; and forming a boron-and-carbon-containing layer on the substrate, wherein the boron-and-carbon-containing layer consists essentially of boron, carbon, and hydrogen.

17. The semiconductor processing method of claim 16, wherein the processing region of the semiconductor processing chamber is maintained plasma-free while forming the boron-and-carbon-containing layer on the substrate.

18. The semiconductor processing method of claim 16, wherein the boron-and-carbon-containing layer is characterized by a thickness conformality of greater than or about 95%.

* * * * *